(12) United States Patent
Henson et al.

(10) Patent No.: US 11,824,542 B1
(45) Date of Patent: Nov. 21, 2023

(54) BIPOLAR HIGH VOLTAGE PULSER

(71) Applicant: Eagle Harbor Technologies, Inc., Seattle, WA (US)

(72) Inventors: Alex Henson, Seattle, WA (US); Kevin Muggli, Mountlake Terrace, WA (US); Timothy Ziemba, Bainbridge Island, WA (US); Kenneth Miller, Seattle, WA (US)

(73) Assignee: Eagle Harbor Technologies, Inc., Seattle, WA (US)

( * ) Notice: Subject to any disclaimer, the term of this patent is extended or adjusted under 35 U.S.C. 154(b) by 0 days.

(21) Appl. No.: 17/853,891

(22) Filed: Jun. 29, 2022

(51) Int. Cl.
*H03K 3/57* (2006.01)
*H02M 3/07* (2006.01)

(52) U.S. Cl.
CPC ............. *H03K 3/57* (2013.01); *H02M 3/07* (2013.01)

(58) Field of Classification Search
None
See application file for complete search history.

(56) References Cited

U.S. PATENT DOCUMENTS 10,381,949 B2 * 8/2019 Hamerski ............... H02M 7/23
10,804,886 B2 * 10/2020 Miller .................... H03K 17/56
11,004,660 B2 * 5/2021 Prager ............... H01J 37/32183

* cited by examiner

*Primary Examiner* — Jeffery S Zweizig

(57) ABSTRACT

A bipolar high voltage bipolar pulsing power supply is disclosed that can produce high voltage bipolar pulses with a positive high voltage pulse greater than about 2 kV followed by a negative high voltage pulse less than about −2 kV with a positive to negative dwell period between the positive high voltage pulse and the negative high voltage pulse. A high voltage bipolar pulsing power supply, for example, can reproduce high voltage pulses with a pulse repetition rate greater than about 10 kHz.

22 Claims, 13 Drawing Sheets

BIPOLAR HIGH VOLTAGE PULSER

BACKGROUND

High voltage pulsing power supplies have application in a number of fields. But power supplies that produce high voltage pulses at high pulse repetition frequencies are not available due to various technical limitations.

SUMMARY

A bipolar high voltage pulsing power supply is disclosed that can produce high voltage bipolar pulses with a positive high voltage pulse greater than about 200 V followed by a negative high voltage pulse less than about −200 V with a positive to negative dwell period between the positive high voltage pulse and the negative high voltage pulse. A high voltage bipolar pulsing power supply, for example, can reproduce high voltage pulses with a high pulse repetition rate greater than about 10 kHz.

A bipolar high voltage bipolar pulsing power supply, for example, is disclosed that can produce high voltage bipolar pulses with a positive high voltage pulse greater than about 2 kV followed by a negative high voltage pulse less than about −2 kV with a positive to negative dwell period between the positive high voltage pulse and the negative high voltage pulse. A high voltage bipolar pulsing power supply, for example, can reproduce high voltage pulses with a high pulse repetition rate greater than about 10 kHz.

A high voltage bipolar pulsing power supply, for example, is disclosed that includes a DC source; an energy storage capacitor coupled with the DC source; a first high voltage switch electrically coupled with the DC source and the energy storage capacitor; a first diode arranged across the first high voltage switch; a second high voltage switch electrically coupled with the DC source and the energy storage capacitor; a second diode arranged across the second high voltage switch; a third high voltage switch arranged in series between the first high voltage switch and ground; a third diode arranged across the third high voltage switch; a fourth high voltage switch arranged in series between the second high voltage switch and ground; a fourth diode arranged across the fourth high voltage switch; and an output having a first lead electrically coupled between first high voltage switch and the third high voltage switch and the second lead electrically coupled between second high voltage switch and the fourth high voltage switch.

In some examples, the first high voltage switch, the second high voltage switch, the third high voltage switch, and/or the fourth high voltage switch each have a capacitance less than about 10 nF.

In some examples, the first high voltage switch comprises a first plurality of solid state switches arranged in parallel, the second high voltage switch comprises a second plurality of solid state switches arranged in parallel, the third high voltage switch comprises a third plurality of solid state switches arranged in parallel, and/or the fourth high voltage switch comprise a fourth plurality of solid state switches arranged in parallel.

In some examples, the first high voltage switch, the second high voltage switch, the third high voltage switch, and/or the fourth high voltage switch each comprise a switch selected from the group consisting of an IGBT, a MOSFET, a SiC MOSFET, a SiC junction transistor, a FET, a SiC switch, a GaN switch, and a photoconductive switch.

In some examples, the circuit comprising both the DC source and the energy storage capacitor has an inductance less than about 10 nH.

In some examples, the circuit comprising both the first high voltage bipolar pulsing power supply and the second high voltage switch has an inductance less than about 10 nH.

In some examples, the first lead of the output is coupled with a first lead of an electrode and the second lead of the output is coupled with a second lead of the electrode.

The high voltage bipolar pulsing power supply, for example, can also include a first tail sweeper switch and a first tail sweeper resistor arranged in series across the first high voltage switch; a second tail sweeper switch and a second tail sweeper resistor arranged in series across the first high voltage switch; a third tail sweeper switch and a third tail sweeper resistor arranged in series across the first high voltage switch; and a fourth tail sweeper switch and a fourth tail sweeper resistor arranged in series across the first high voltage switch.

A high voltage, multilevel, bipolar pulsing power supply, for example, is disclosed that includes: a first DC source; a first energy storage capacitor coupled with the first DC source; a first diode having an anode and a cathode, the anode electrically coupled with the first DC source and the first energy storage capacitor; a first high voltage switch electrically coupled with the cathode of the first diode; a first diode arranged across the first high voltage switch; a second high voltage switch electrically coupled with the cathode of the first diode; a second diode arranged across the second high voltage switch; a third high voltage switch arranged in series between the first high voltage switch and ground; a third diode arranged across the third high voltage switch; a fourth high voltage switch arranged in series between the second high voltage switch and ground; a fourth diode arranged across the fourth high voltage switch; a second DC source; a second energy storage capacitor coupled with the second DC source; a fifth high voltage switch electrically coupled with the second DC source and the second energy storage capacitor; a fifth diode arranged across the fifth high voltage switch; a sixth high voltage switch electrically coupled with the cathode of the second DC source and the second energy storage capacitor; a sixth diode arranged across the sixth high voltage switch; and an output having a first lead electrically coupled between first high voltage switch and the third high voltage switch and the second lead electrically coupled between second high voltage switch and the fourth high voltage switch.

In some embodiments, the second DC source produces a voltage greater than the first DC source.

In some embodiments, the first high voltage switch, the fourth high voltage switch, and the fifth high voltage switch are closed to produce a voltage at the output equal to a voltage of the second DC source; the second high voltage switch, the third high voltage switch, and the sixth high voltage switch are closed to produce a voltage at the output equal to a negative voltage of the second DC source; the first high voltage switch and the fourth high voltage switch are closed to produce a voltage at the output equal to a voltage of the first DC source; and the second high voltage switch and the third high voltage switch are closed to produce a voltage at the output equal to a negative voltage of the first DC source.

In some examples, the first high voltage switch, the second high voltage switch, the third high voltage switch, the fourth high voltage switch, the fifth high voltage switch, and the sixth high voltage switch each have a capacitance less than about 500 pF.

The high voltage bipolar pulsing power supply, for example, may also include a first tail sweeper switch and a first tail sweeper resistor arranged in series across the first high voltage switch; a second tail sweeper switch and a second tail sweeper resistor arranged in series across the first high voltage switch; a third tail sweeper switch and a third tail sweeper resistor arranged in series across the first high voltage switch; a fourth tail sweeper switch and a fourth tail sweeper resistor arranged in series across the first high voltage switch; a fifth tail sweeper switch and a fifth tail sweeper resistor arranged in series across the fifth high voltage switch; and a sixth tail sweeper switch and a sixth tail sweeper resistor arranged in series across the sixth high voltage switch.

A high voltage, multilevel, bipolar pulsing power supply, for example, is disclosed that includes: a DC source; an energy storage capacitor coupled with the DC source; a diode having an anode and a cathode, the anode electrically coupled with the DC source and the energy storage capacitor; a first high voltage switch electrically coupled with the cathode of the diode; a first diode arranged across the first high voltage switch; a first tail sweeper switch and a first tail sweeper resistor arranged in series across the first high voltage switch; a second high voltage switch electrically coupled with the cathode of the diode; a second diode arranged across the second high voltage switch; a second tail sweeper switch and a second tail sweeper resistor arranged in series across the first high voltage switch; a third high voltage switch arranged in series between the first high voltage switch and ground; a third diode arranged across the third high voltage switch; a third tail sweeper switch and a third tail sweeper resistor arranged in series across the first high voltage switch; a fourth high voltage switch arranged in series between the second high voltage switch and ground; a fourth diode arranged across the fourth high voltage switch; a fourth tail sweeper switch and a fourth tail sweeper resistor arranged in series across the first high voltage switch; and an output having a first lead electrically coupled between first high voltage switch and the third high voltage switch and the second lead electrically coupled between second high voltage switch and the fourth high voltage switch.

In some examples, the first tail sweeper switch is closed prior to the first high voltage switch being closed; the second tail sweeper switch is closed prior to the second high voltage switch being closed; the third tail sweeper switch is closed prior to the third high voltage switch being closed; and the fourth tail sweeper switch is closed prior to the fourth high voltage switch being closed.

In some examples, the first high voltage switch, the second high voltage switch, the third high voltage switch, and the fourth high voltage switch each comprise a switch selected from the group consisting of an IGBT, a MOSFET, a SiC MOSFET, a SiC junction transistor, a FET, a SiC switch, a GaN switch, and a photoconductive switch.

In some examples, the first tail sweeper switch, the second tail sweeper switch, the third tail sweeper switch, and the fourth tail sweeper switch each comprise a switch selected from the group consisting of an IGBT, a MOSFET, a SiC MOSFET, a SiC junction transistor, a FET, a SiC switch, a GaN switch, and a photoconductive switch.

In some examples, the circuit between the diode and both the DC source and the energy storage capacitor has an inductance less than about 10 nH.

In some examples, the circuit between the diode and the first high voltage bipolar pulsing power supply and the second high voltage switch has an inductance less than about 10 nH.

In some examples, the first lead of the output is coupled with a first lead of an electrode and the second lead of the output is coupled with a second lead of the electrode.

The various embodiments and examples described in the summary and this document are provided not to limit or define the disclosure or the scope of the claims.

DETAILED DESCRIPTION

A bipolar high voltage bipolar pulsing power supply is disclosed. A bipolar and high voltage, multilevel bipolar pulsing power supply is also disclosed. A high voltage bipolar pulsing power supply can produce high voltage bipolar pulses that include a positive high voltage pulse greater than about 100 V, 200 V, 500 V, 1 kV, 2 kV, 5 kV, 10 kV, etc. followed by a negative high voltage pulse less than about −100 V, −200 V, −500 V, −1 kV, −2 kV, −5 kV, 10 kV etc. with a positive to negative dwell between the positive high voltage pulse and the negative high voltage pulse. The high voltage bipolar pulsing power supply can reproduce these high voltage pulses with a high pulse repetition rate greater than about 10 kHz.

Figure 1:
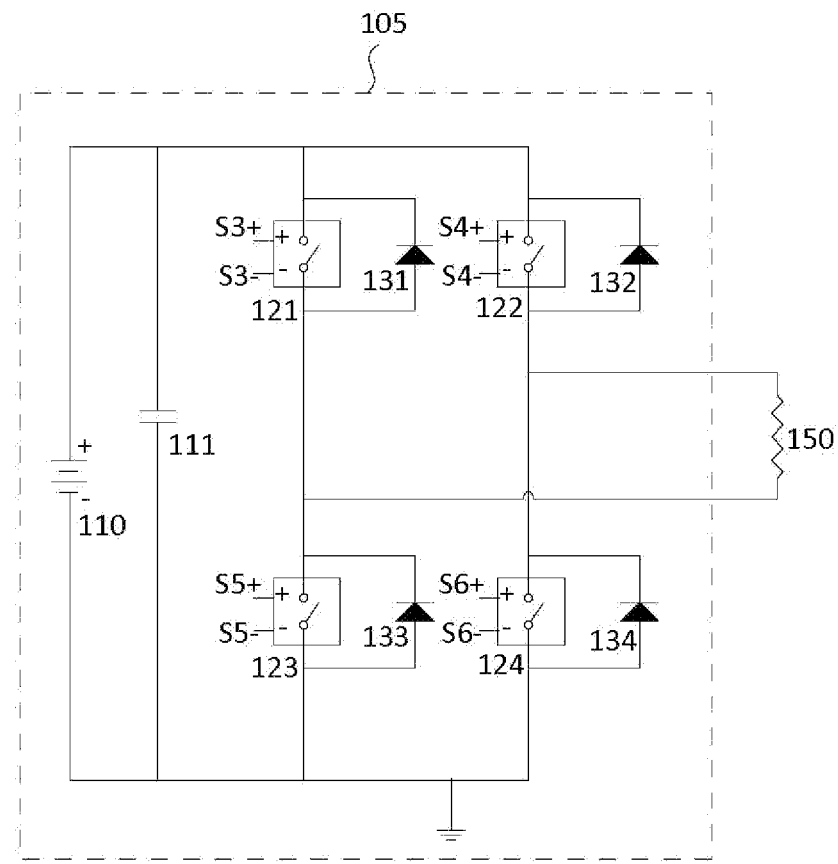
FIG. 1 is an example illustration of a high voltage bipolar pulsing power supply driving a load.

FIG. 1 is an example illustration of a high voltage bipolar pulsing power supply 105 driving a load 150.

The high voltage bipolar pulsing power supply 105 may include a first DC source 110 and an energy storage capacitor 111. The first DC source 110, for example, may include a high voltage bipolar pulsing power supply that charges the energy storage capacitor 111. The energy storage capacitor 111, for example, may include a capacitor having a capacitance of about 80 nF to about 250 nF or about 2 μF to 100 μF.

The high voltage bipolar pulsing power supply 105, for example, may include the first switch circuit 121, the second switch circuit 122, the third switch circuit 123, and the fourth switch circuit 124. Each of the switch circuits 121, 122, 123, or 124, for example, may include a plurality of switches in series or in parallel such as, for example, four switches, eight switches, twelve switches, etc. arranged in parallel.

The first switch circuit 121 may be coupled with the first DC source 110 and a first side of load 150. The third switch circuit 123 may be coupled with ground and the first side of load 150 and first switch circuit 121. The second switch circuit 122 may be coupled with the first DC source 110 and a second side of the load 150. The fourth switch circuit 124 may be coupled with ground, the second side of load 150, and the second switch circuit 122.

Each of the switch circuits 121, 122, 123, and 124, for example, may include one or more of any type of solid-state switch such as, for example, IGBTs, a MOSFETs, a SiC MOSFETs, SiC junction transistors, FETs, SiC switches, GaN switches, photoconductive switches, etc. Each of the switch circuits 121, 122, 123, and 124 may be switched at high frequencies and/or may produce a high voltage pulses. These frequencies may, for example, include frequencies of about 1 kHz, 5 kHz, 10 kHz, 25 kHz, 50 kHz, 100 kHz, etc.

Each switch of the switch circuits 121, 122, 123, and 124 may be coupled in parallel with a respective bridge diode, may have a stray capacitance, and/or may have stray inductance. The stray inductances of each of the switch circuits 121, 122, 123, and 124 may be substantially equal. The stray inductances of each of the switch circuits 121, 122, 123, and 124, for example, may be less than about 5 nH, 10 nH, 50 nH, 100 nH, 150 nH, etc. The stray capacitance of each of the switch circuits 121, 122, 123, and 124, for example, may be low such as, for example, less than about 400 nF, 200 nF, 100 nF, 50 nF, 25 nF, 10 nF, etc. If each switch of the switch circuits 121, 122, 123, and 124 may include multiple individual switches, then the combination of the multiple individual switches may have a capacitance of less than about 150 nF, 100 nF, 50 nF, 25 nF 10 nF, 5 nF, etc.

The combination of a switch (e.g., one of the switch circuits 121, 122, 123, or 124), a respective diode (e.g., one of diodes 131, 132, 133, and 134), and related circuitry may have a stray inductance of less than about 5 nH, 10 nH, 50 nH, 100 nH, 150 nH, etc. The high voltage bipolar pulsing power supply 105 may include low stray inductance throughout the circuit such as, for example, an inductance less than about 5 nH, 10 nH, 50 nH, 100 nH, 150 nH, 200 nH, etc.

The load 150 may comprise any type of load. For example, the load 150 may have an output resistance less than about 250 ohms, 100 ohms, 50 ohms, 25 ohms, 10 ohms, 5 ohms, 2 ohms, 1 ohm, etc. The load 150, for example, may include an electromagnetic coil, a one or two lead electrode, a transformer, etc. The load 150, for example, may be part of a metal 3D printing process, an electrode for ablation, an electrode for electroporation, water purification, etc. The load 150 may include a transformer that may be used to increase the power produced by the high voltage bipolar pulsing power supply 105.

Figure 2A:
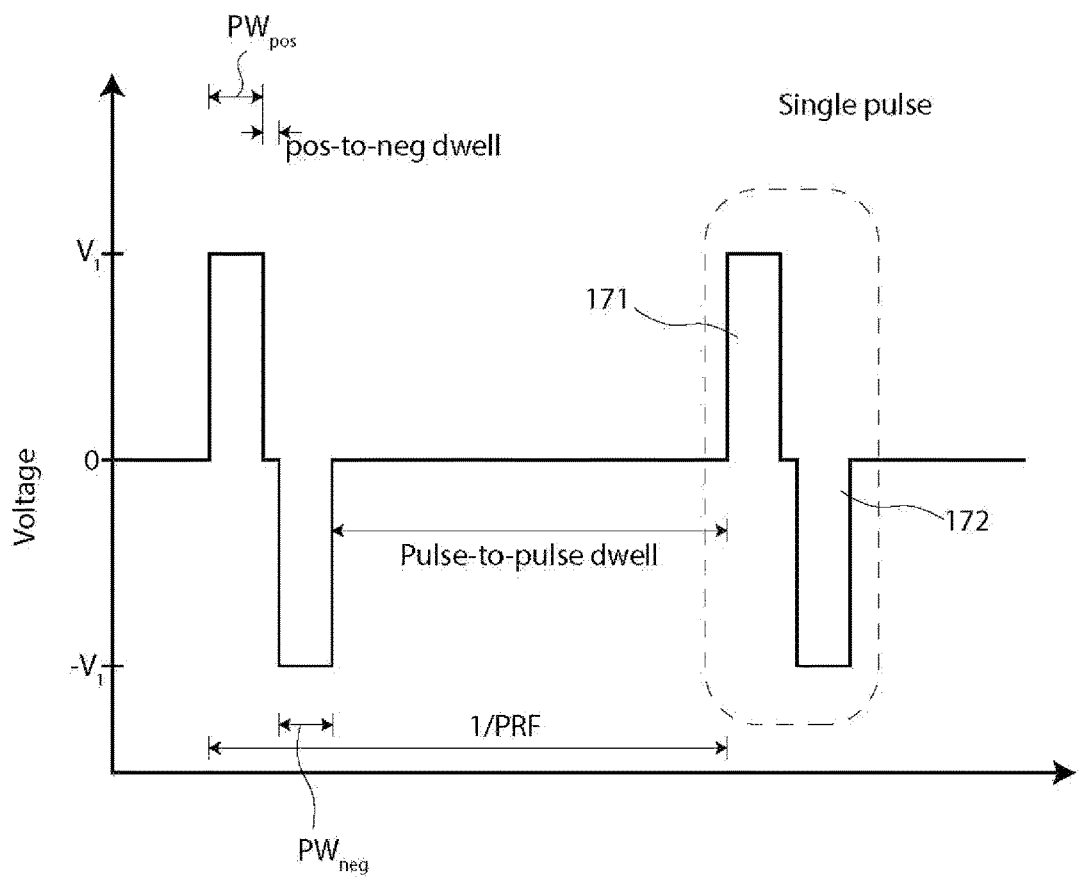
FIG. 2A shows an output waveform at the load from the bipolar pulsing power supply.
Figure 2B:
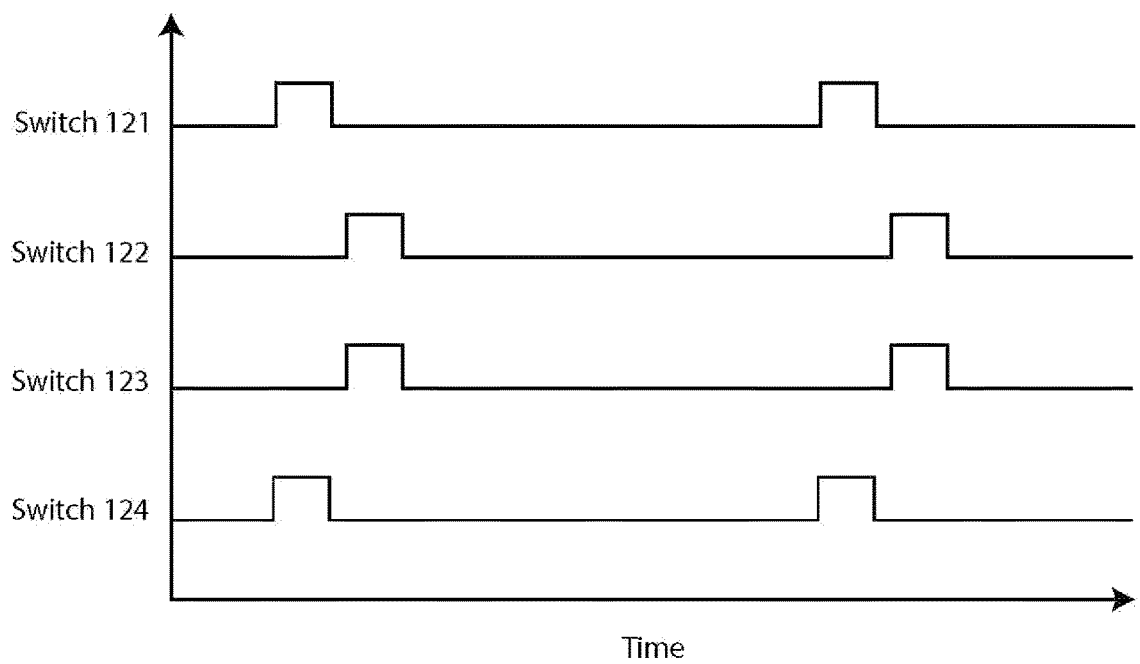
FIG. 2B shows the open and close switch logic of the switches in the bipolar pulsing power supply shown in FIG. 1 to produce the waveforms shown in FIG. 2A.

FIG. 2A shows an output waveform at the load 150 from the high voltage bipolar pulsing power supply 105. FIG. 2B shows the open and close switch logic of the switch circuits 121, 122, 123, and 124 to produce the waveforms shown in FIG. 2A. This output waveform comprises a positive pulse 171 and a negative pulse 172. When the first switch circuit 121 and the fourth switch circuit 124 are closed and the second switch circuit 122 and the third switch circuit 123 are open the positive pulse 171 is formed. When the second switch circuit 122 and the third switch circuit 123 are closed and the first switch circuit 121 and the fourth switch circuit 124 are open the negative pulse 172 is formed.

Each positive pulse 171 in FIG. 2A has a voltage of $V_1$ and each negative pulse 172 in FIG. 2A has a negative voltage of $-V_1$. The voltage $V_1$ is the voltage from the energy storage capacitor 111 and/or the first DC source 110, $V_1$. The time between the positive pulse 171 and the 172 is the dwell. The time between each consecutive positive pulse 171 is the inverse of the pulse repetition frequency (1/PRF). The time between the end of the first negative pulse 172 and the start of the first positive pulse is the pulse-to-pulse dwell. The pulse width of the positive pulse is the $PW_{pos}$ and the pulse width of the negative pulse is the $PW_{neg}$.

Figure 3A:
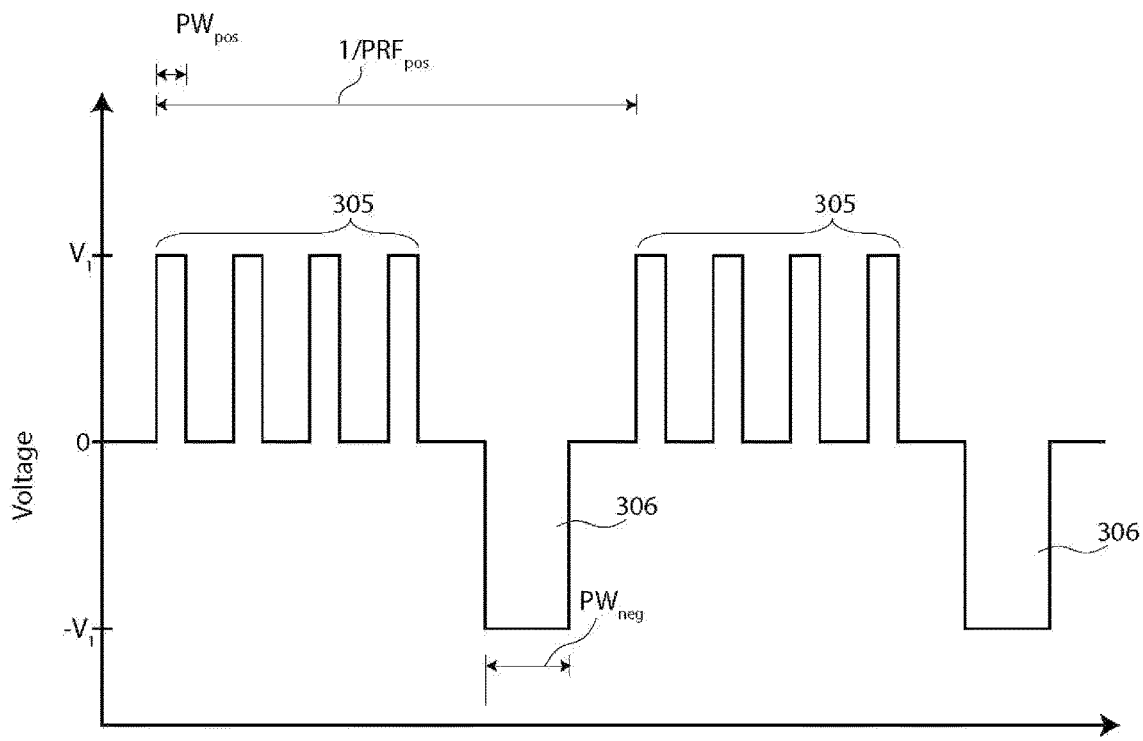
FIG. 3A shows an output waveform at the load from the bipolar pulsing power supply.
Figure 3B:
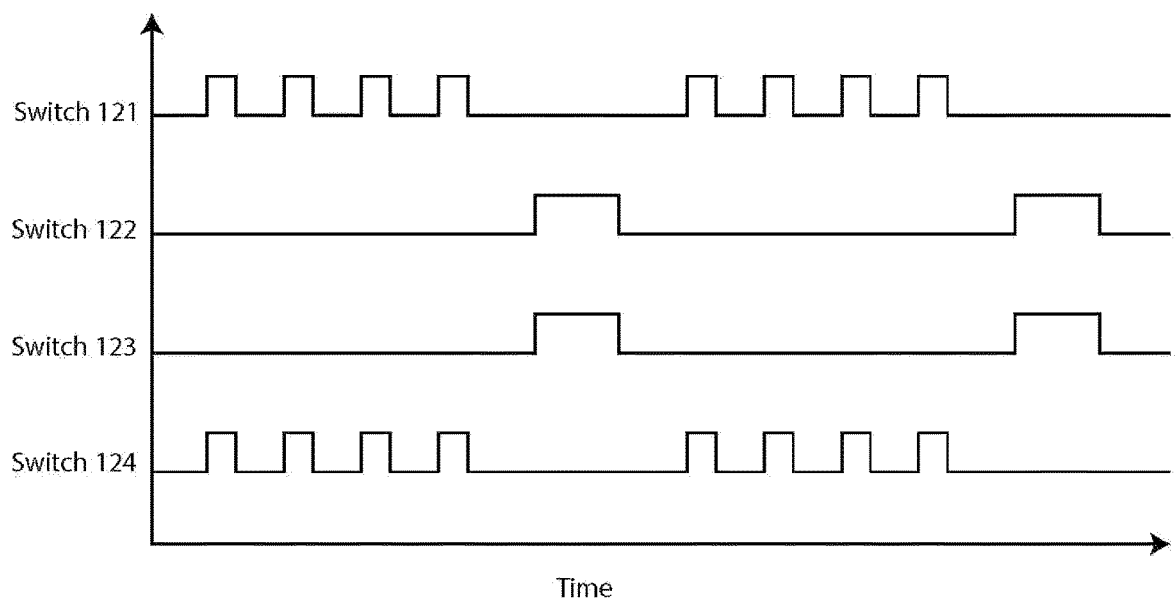
FIG. 3B shows the open and close switch logic of the switches in the bipolar pulsing power supply shown in FIG. 1 to produce the waveforms shown in FIG. 3A.

FIG. 3A shows an output waveform at the load 150 from the high voltage bipolar pulsing power supply 105 with a plurality of positive pulses 305 followed by a negative pulse 306. FIG. 3B shows the open and close switch logic of the switch circuits 121, 122, 123, and 124 to produce the waveforms shown in FIG. 3A. This output waveform comprises a plurality of positive pulses 305 and a longer negative pulse 306. When the first switch circuit 121 and the fourth switch circuit 124 are closed and the second switch circuit 122 and the third switch circuit 123 are open the each one of the plurality of positive pulses 305 are formed. When the second switch circuit 122 and the third switch circuit 123 are closed and the first switch circuit 121 and the fourth switch circuit 124 are open the negative pulse 306 is formed.

Each positive pulse of the plurality of positive pulses 305 in FIG. 3A has a voltage of $V_1$ and each negative pulse 306 in FIG. 3A has a negative voltage of $-V_1$. The voltage $V_1$ is the voltage from the energy storage capacitor 111 and/or the first DC source 110, $V_1$. Each pulse of the plurality of pulses 305 may have a pulse width of $PW_{pos}$, and the pulse width of the negative pulse is the $PW_{neg}$. The time between the first pulse of the plurality of positive pulses 305 and the next first pulse of the plurality of pulses 305 is the pulse repetition frequency (1/PRF).

Figure 4A:
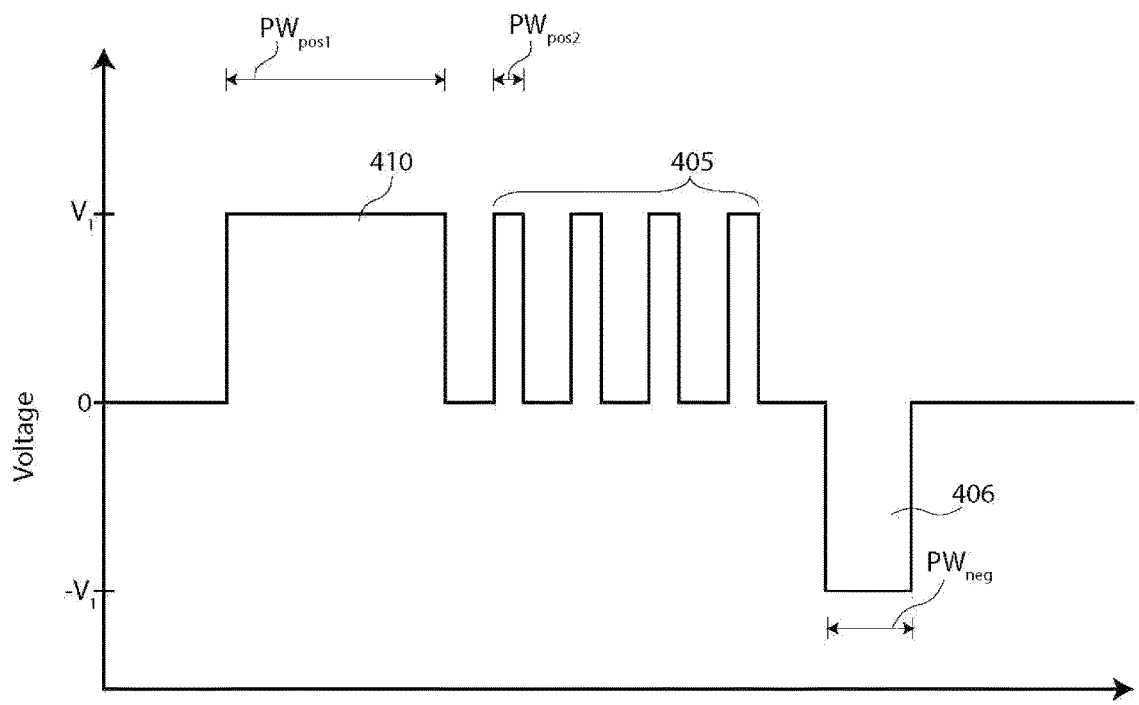
FIG. 4A shows an output waveform at the load from the bipolar pulsing power supply.
Figure 4B:
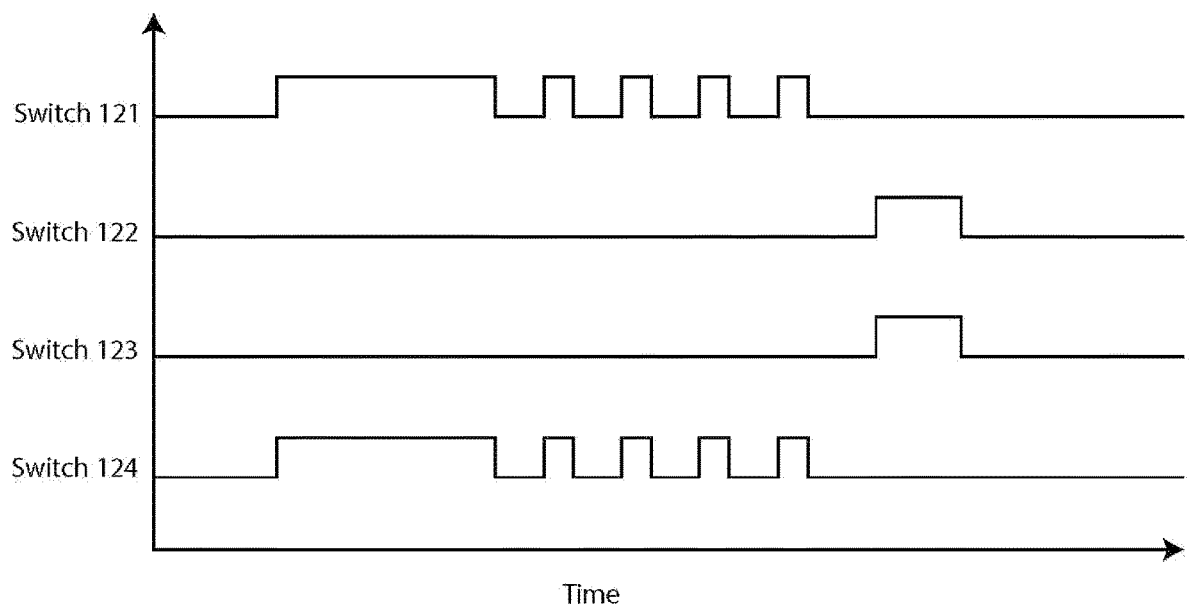
FIG. 4B shows the open and close switch logic of the switches in the bipolar pulsing power supply shown in FIG. 1 to produce the waveforms shown in FIG. 4A.

FIG. 4A shows an output waveform at the load 150 from the bipolar pulsing power supply 105 with a positive first longer pulse 410, a plurality of positive pulses 405 followed by a negative pulse 406. FIG. 3B shows the open and close switch logic of the switch circuits 121, 122, 123, and 124 to produce the waveforms shown in FIG. 4A. When the first switch circuit 121 and the fourth switch circuit 124 are closed and the second switch circuit 122 and the third switch circuit 123 are open the each one of the first positive pulse 410 and the plurality of positive pulses 405 are formed. When the second switch circuit 122 and the third switch circuit 123 are closed and the first switch circuit 121 and the fourth switch circuit 124 are open the negative pulse 406 is formed.

Each positive pulse of the plurality of positive pulses 405 and the long pulse 410 in FIG. 4A has a voltage of $V_1$ and each negative pulse 406 in FIG. 4A has a negative voltage of $-V_1$. The voltage $V_1$ is the voltage from the energy storage capacitor 111 and/or the first DC source 110, $V_1$. Each pulse of the plurality of pulses 405 may have a pulse width of $PW_{pos2}$, the long positive pulse 410 may have a pulse width of $PW_{pos1}$, and the pulse width of the negative pulse is the $PW_{neg}$. The pulse width $PW_{pos1}$ of the long pulse may be longer than the pulse width $PW_{pos2}$ of each of the plurality of positive pulses 405 such as, for example, substantially more than two, three, four, five, ten, twenty, fifty, one hundred, five hundred, etc. times as long, The time between the first pulse of the plurality of positive pulses 305 and the next first pulse of the plurality of pulses 305 is the pulse repetition frequency (1/PRF).

Figure 5:
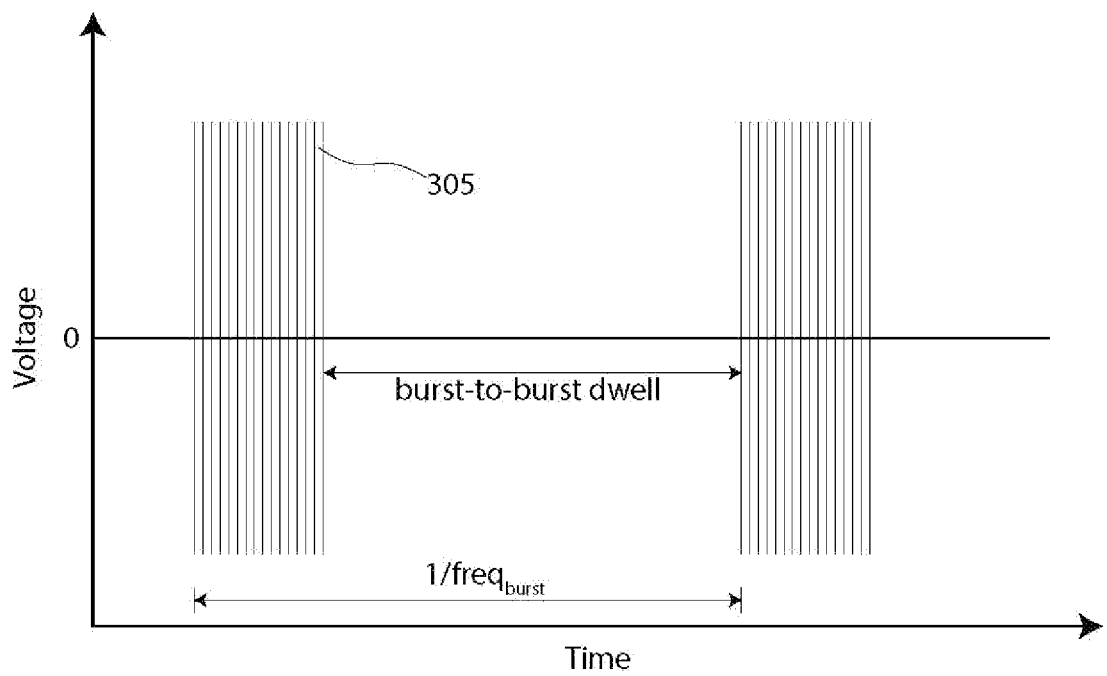
FIG. 5 shows output burst waveforms from a bipolar pulsing power supply.

As shown in FIG. 5, the high voltage bipolar pulsing power supply 105 can produce burst pulses 305 that includes a plurality of bipolar pulses. The time between consecutive bursts is the burst-to-burst dwell and the time between the start of a first burst and the start of a second burst is the inverse of burst frequency ($1/freq_{burst}$).

A controller (e.g., computational system 1300) may be coupled with each switch (e.g., the first switch circuit 121, the second switch circuit 122, the third switch circuit 123, and the fourth switch circuit 124) may control the opening and closing of these switch circuits. The controller may control the switch circuits to produce the waveforms shown in FIG. 2A by opening closing the switch circuits as shown in FIG. 2B. The controller may control the timing of the switch circuits to produce the waveforms shown in FIG. 3.

The controller can control the switch circuits to produce long pulse widths with a low pulse repetition frequency (PRF). For example, the controller can close the first switch circuit 121 and the fourth switch circuit 124 for a long duration (e.g., 5 ms, 2.5 ms, 1 ms, 500 ns, etc.), then open the first switch circuit 121 and the fourth switch circuit 124 and close the second switch circuit 122 and the third switch circuit 123 for a long duration (e.g., 5 ms, 2.5 ms, 1 ms, 500 ns, etc.), and then open the second switch circuit 122 and the third switch circuit 123. The controller can repeat this process after any period of time such as, for example, a pulse repetition frequency of 1 kHz, 10 kHz, 100 kHz, etc.

The controller can control the switch circuits to produce a plurality of short pulses (e.g., 250 ns, 500 ns, 1 ms, 5 ms, etc.) with a high pulse repetition frequency (e.g., 1 kHz, 5 kHz, 10 kHz, 25 kHz, etc.) within a burst and repeat the burst after a period of time (e.g., 250 ms, 500 ms, 1 s, 3 s, 5 s, etc.) such as, for example, as shown in FIG. 3. The controller can repeat these bursts, for example, hundreds or thousands of times.

Figure 6:
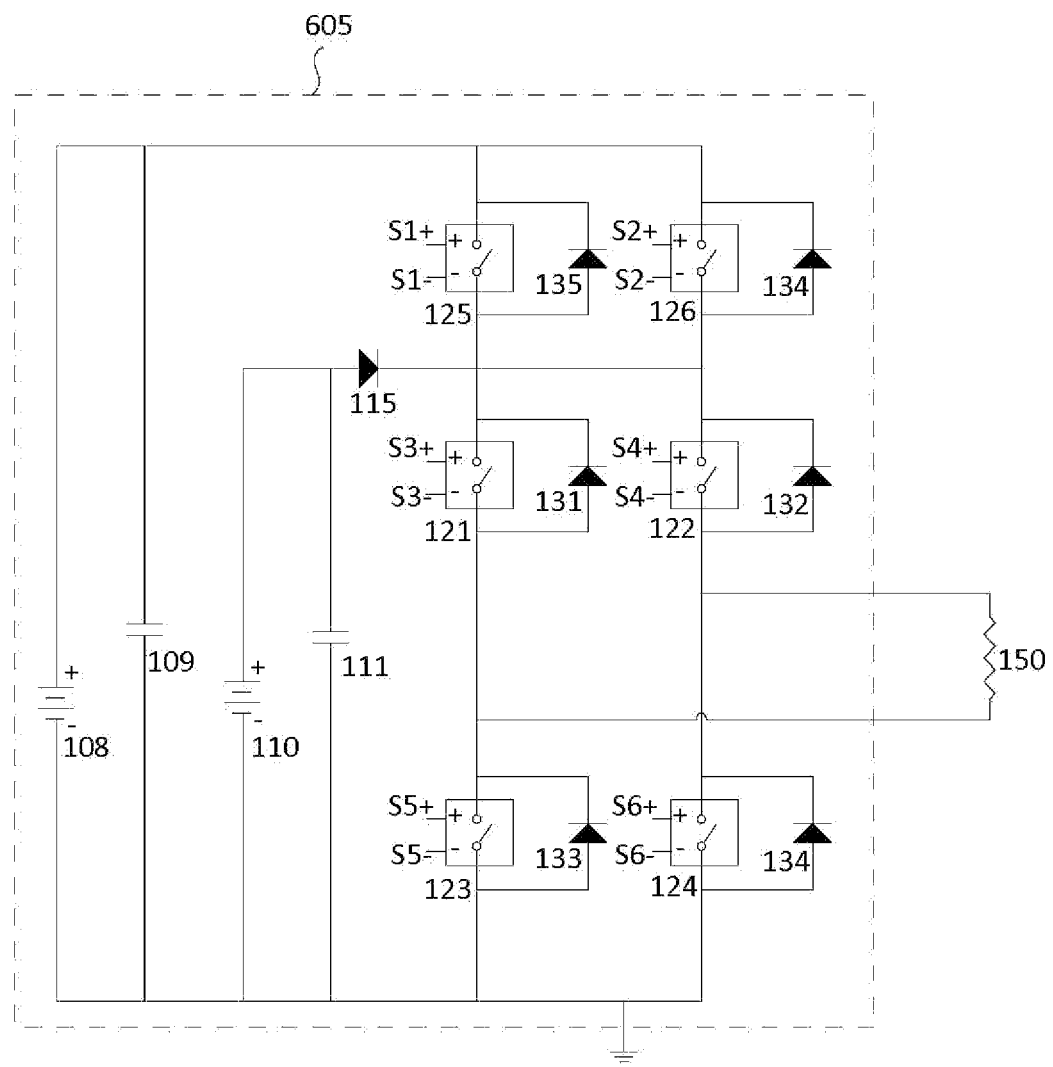
FIG. 6 is an example illustration of a high voltage, bipolar, multilevel, bipolar pulsing power supply driving a load.

FIG. 6 shows an example high voltage, multilevel, bipolar pulsing power supply 605 driving the load 150. The high voltage, multilevel, bipolar pulsing power supply 605 includes the high voltage bipolar pulsing power supply 105 and a fifth switch circuit 125 with a corresponding diode 135, a sixth switch circuit 126 with a corresponding diode 136, a second DC source 108, and a second energy storage capacitor 109. The fifth switch circuit 125 is coupled between the second DC source 108 and the first switch circuit 121. The sixth switch circuit 126 is coupled between the second DC source 108 and the second switch circuit 122. A diode may be included between the second DC source 108 and the fifth switch circuit 125 and between the second DC source 108 and the sixth switch circuit 126.

The second DC source 108 can produce a voltage greater than the first DC source 110.

Figure 7A:
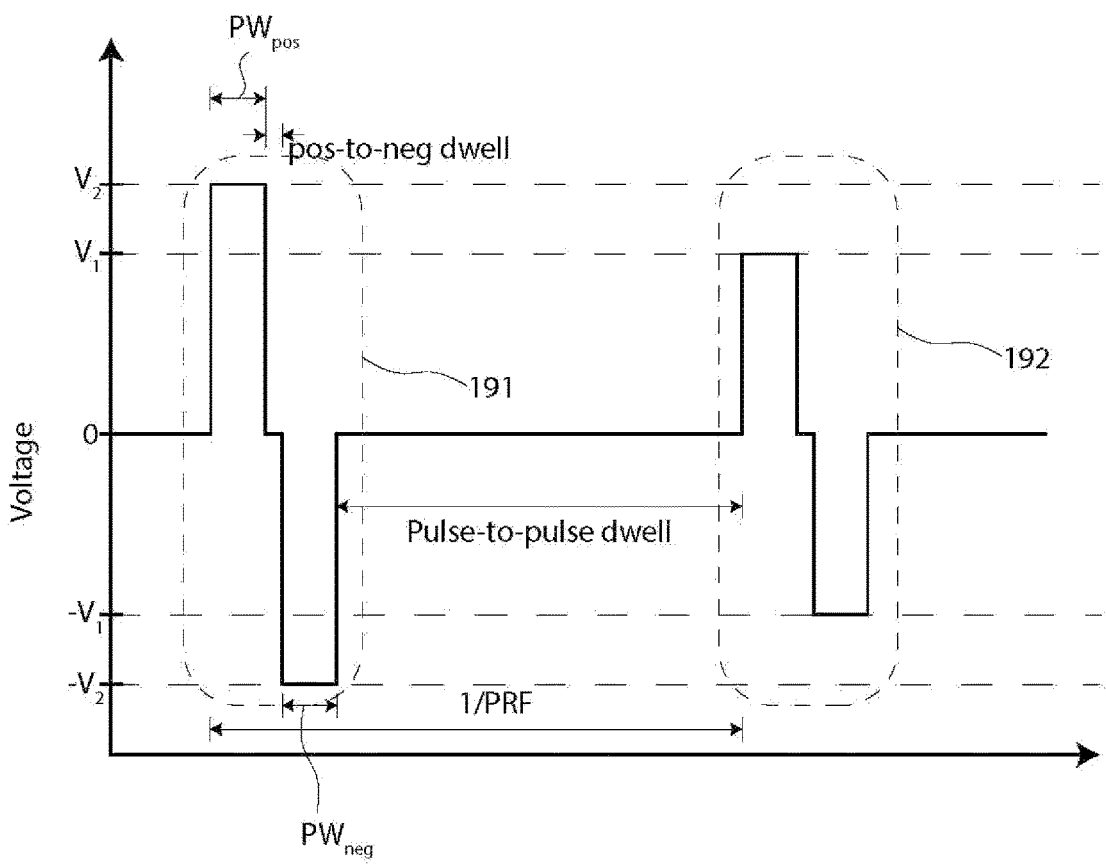
FIG. 7A shows an output waveform at the load from the bipolar, multilevel, pulsing power supply.
Figure 8A:
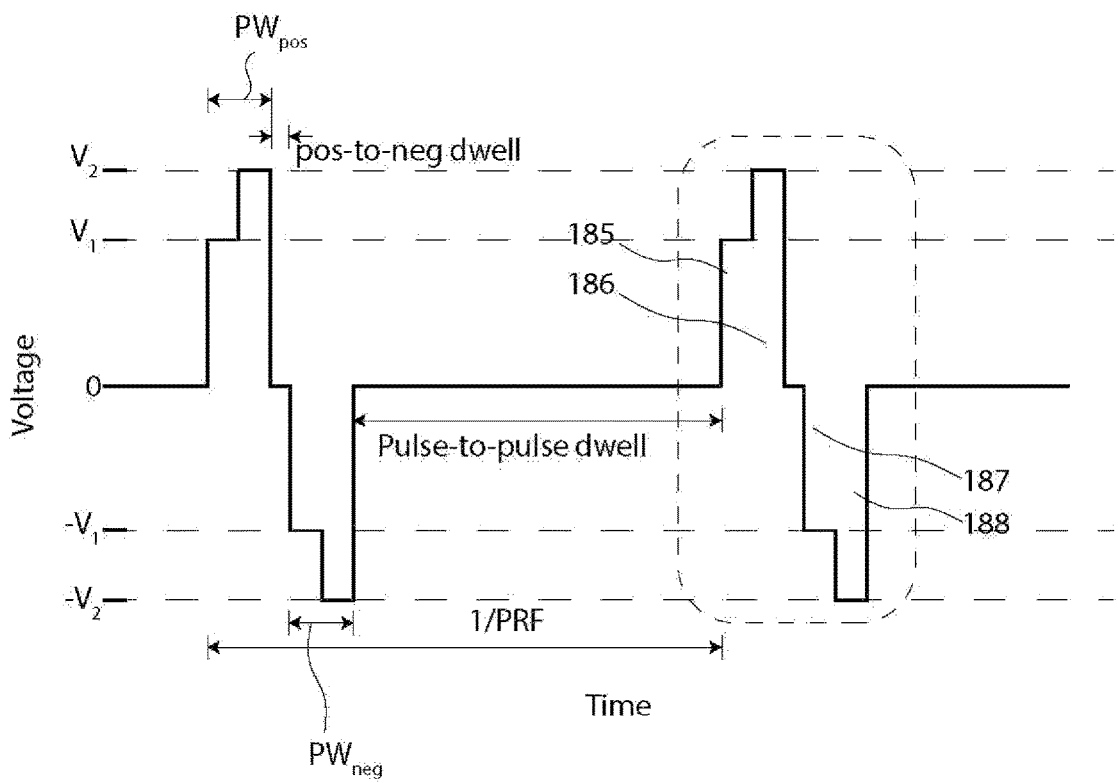
FIG. 8A shows an output waveform at the load from the bipolar, multilevel, pulsing power supply.

The diode 115 ensures charge flows from the energy storage capacitor 111, through the closed switch circuits, either the first switch circuit 121 and the fourth switch circuit 124 or the second switch circuit 122 and the third switch circuit 123 to the load 150. The high voltage, multilevel, bipolar pulsing power supply 605 can produce either 1) bipolar pulses with a high voltage as shown in FIG. 7A or 2) bipolar and multilevel pulses as shown in FIG. 8A. In FIG. 7A the first pulse 191 has a voltage of $V_1$, which is the voltage of first DC source 110, and the second pulse 192 has a voltage $V_2$, which is the voltage of the second DC source 108.

Figure 7B:
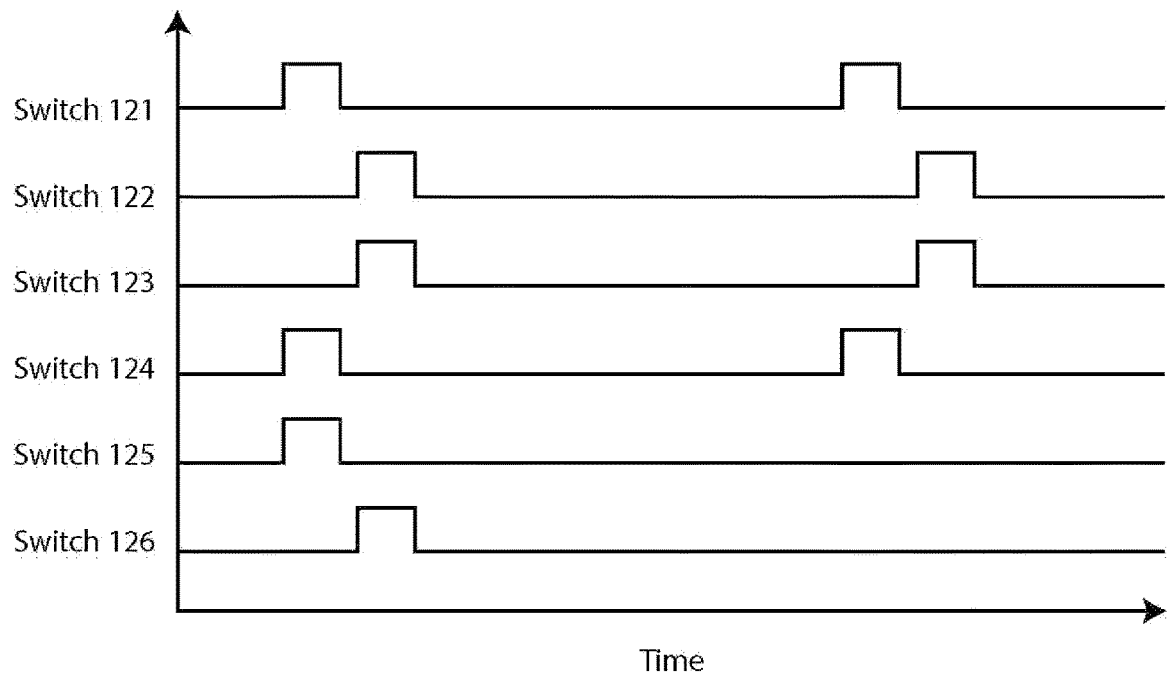
FIG. 7B shows the open and close switch logic of the switches in the bipolar, multilevel, pulsing power supply shown in FIG. 6 to produce the waveforms shown in FIG. 7A.

FIG. 7B shows the shows the open and close switch logic of the switch 121, 122, 123, 124, 125, and 126, to produce the bipolar waveforms shown in FIG. 7A. The positive portion of the first pulse 191 is formed with a voltage $V_2$, when the fifth switch circuit 125, the first switch circuit 121, and the fourth switch circuit 124 are closed and the sixth switch circuit 126, the second switch circuit 122 and the third switch circuit 123 are open. The negative portion of the first pulse 191 is formed with a voltage $V_2$, when the sixth switch circuit 126, the second switch circuit 122, and the third switch circuit 123 are closed and the fifth switch circuit 125, the first switch circuit 121, and the fourth switch circuit 124 are open. The positive portion of the second pulse 192 is formed with a voltage $V_1$, when the first switch circuit 121 and the fourth switch circuit 124 are closed and the sixth switch circuit 126, the second switch circuit 122, the fifth switch circuit 125, and the third switch circuit 123 are open. The negative portion of the second pulse 192 is formed with a voltage $V_2$, when the second switch circuit 122 and the third switch circuit 123 are closed and the fifth switch circuit 125, the sixth switch circuit 126, the first switch circuit 121, and the fourth switch circuit 124 are open.

Figure 8B:
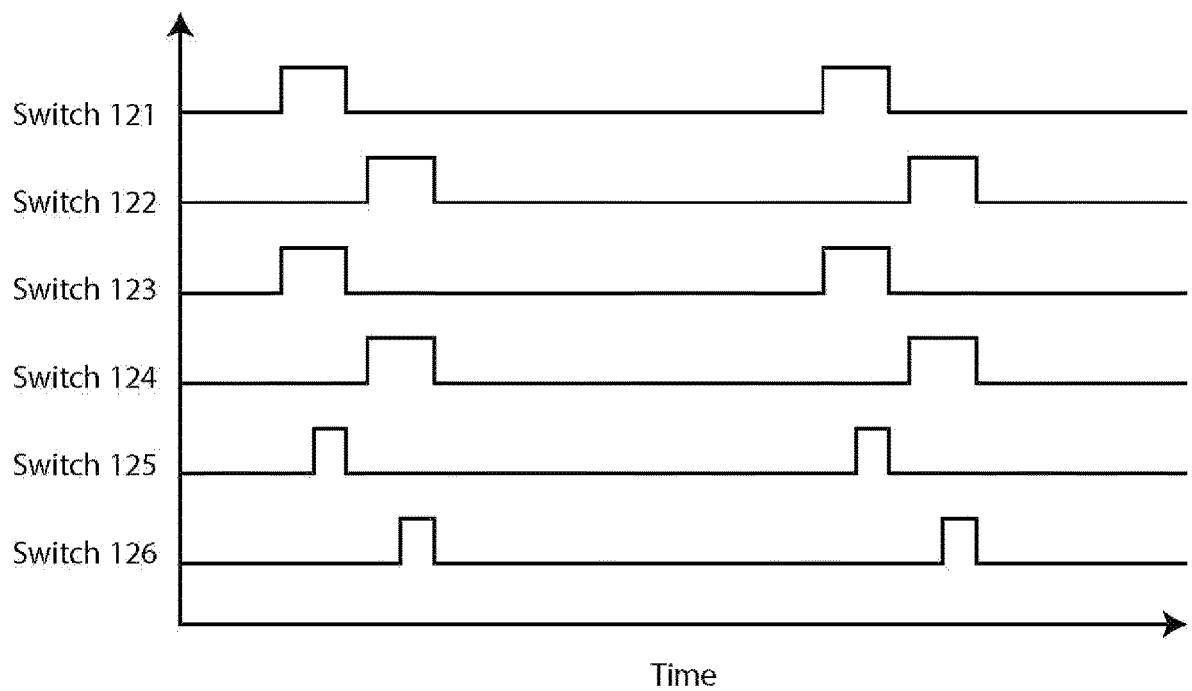
FIG. 8B shows the open and close switch logic of the switches in the bipolar, multilevel, pulsing power supply shown in FIG. 6 to produce the waveforms shown in FIG. 8A.

FIG. 8B shows the shows the open and close switch logic of the switch circuits 121, 122, 123, 124, 125, and 126 to produce the multilevel bipolar waveforms shown in FIG. 8A. When the first switch circuit 121 and the fourth switch circuit 124 are closed and the fifth switch circuit 125, the sixth switch circuit 126, the second switch circuit 122, and the third switch circuit 123 are open, first level positive pulse 185 is formed at voltage $V_1$. When the switch, 125, the first switch circuit 121 and the fourth switch circuit 124 are closed and the sixth switch circuit 126, the second switch circuit 122, and the third switch circuit 123 are open, the second level positive pulse 186 is formed at voltage $V_2$. The combination of the first level positive pulse 185 and the second level positive pulse 186 forms a multilevel positive pulse. When the second switch circuit 122 and the third switch circuit 123 are closed and the fifth switch circuit 125, the sixth switch circuit 126, the first switch circuit 121, and the fourth switch circuit 124 are open, the first level negative pulse 187 is formed at voltage $-V_1$. When the switch, 126, the second switch circuit 122, and the third switch circuit 123 are closed and the fifth switch circuit 125, the first switch circuit 121, and the fourth switch circuit 124 are open, second level negative pulse 188 is formed at voltage $-V_2$. The combination of the first level negative pulse 187 and the second level negative pulse 188 forms a multilevel negative pulse. The $V_2$ is the voltage of the second DC source 108.

Figure 9A:
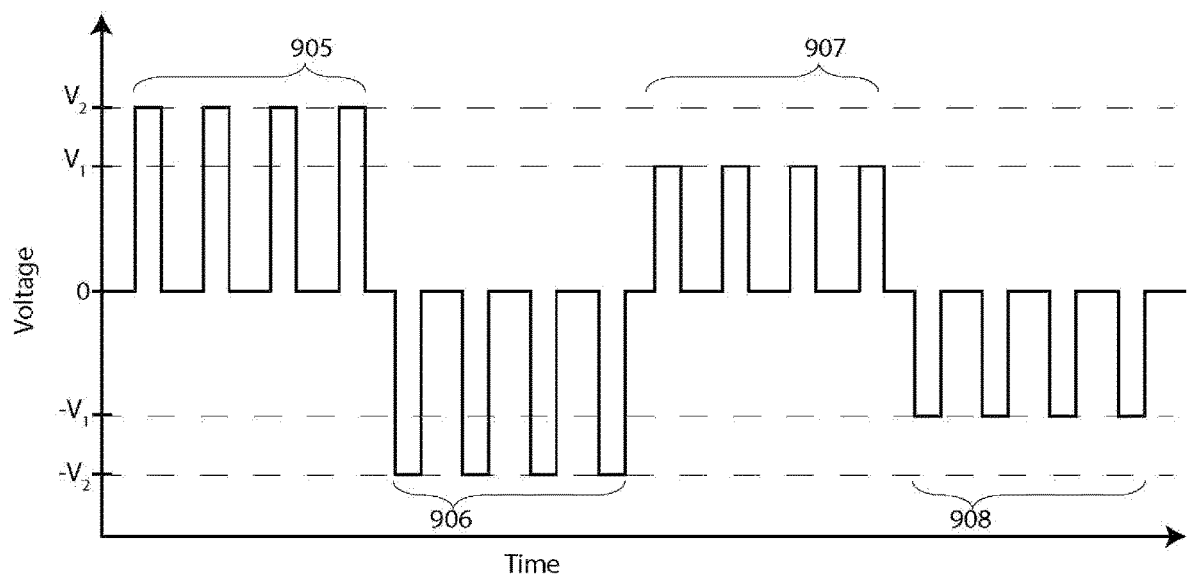
FIG. 9A shows an output waveform at the load from the bipolar, multilevel, pulsing power supply.
Figure 9B:
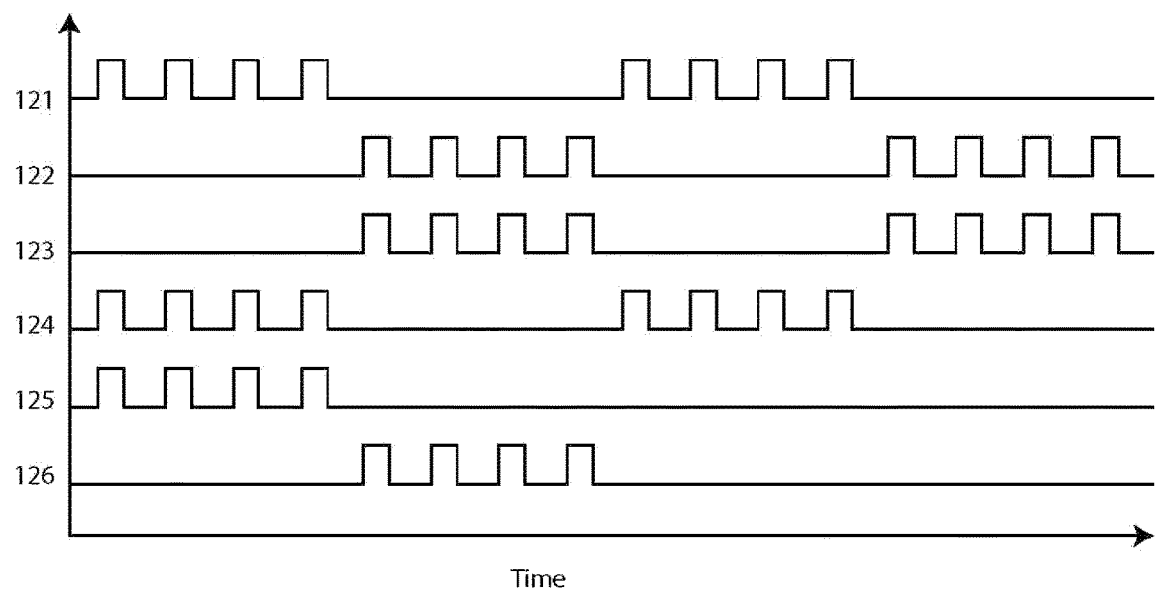
FIG. 9B shows the open and close switch logic of the switches in the bipolar, multilevel, pulsing power supply shown in FIG. 6 to produce the waveforms shown in FIG. 8A.

FIG. 9B shows the shows the open and close switch logic of the switch circuits 121, 122, 123, 124, 125, and 126 to produce the multilevel bipolar waveforms shown in FIG. 9A. FIG. 9A shows a first burst of pulses 905 having a voltage $V_2$, a second burst of pulses 906 having a negative voltage $V_2$, a third burst of pulses 907 having a voltage $V_1$, and a fourth burst of pulses 908 having a negative voltage $V_1$. The first burst of pulses 905 may include any number of pulses; the second burst of pulses 906 may include any number of pulses; the third burst of pulses 907 may include any number of pulses; and/or the fourth burst of pulses 908 may include any number of pulses. The bursts of pulses may occur in any order or sequence. The first burst of pulses 905, the second plurality of pulses 906, the third plurality of pulses 907, and/or the fourth plurality of pulses 908 may have any pulse repetition frequency and/or each pulse of the plurality of pulses may have any pulse widths.

The first burst of pulses 905 with a voltage $V_2$ may be created by closing the first switch circuit 121, the fourth switch circuit 124, and the fifth switch circuit 125; and opening the second switch circuit 122, the third switch circuit 123, and the sixth switch circuit 126. The second burst of pulses 906 with a negative voltage $V_2$ may be created by closing the second switch circuit 122, the third switch circuit 123, and the sixth switch circuit 126; and opening the first switch circuit 121, the fourth switch circuit 124, and the fifth switch circuit 125. The third burst of pulses 907 with a voltage $V_1$ may be created by closing the first switch circuit 121 and the fourth switch circuit 124; and opening the second switch circuit 122, the third switch circuit 123, the fifth switch 125, and the sixth switch 126. The fourth burst of pulses 908 with a negative voltage $V_1$ may be created by closing the second switch circuit 122 and the third switch circuit 123; and opening the first switch circuit 121, the fourth switch circuit 124, the fifth switch 125, and the sixth switch 126.

Figure 10:
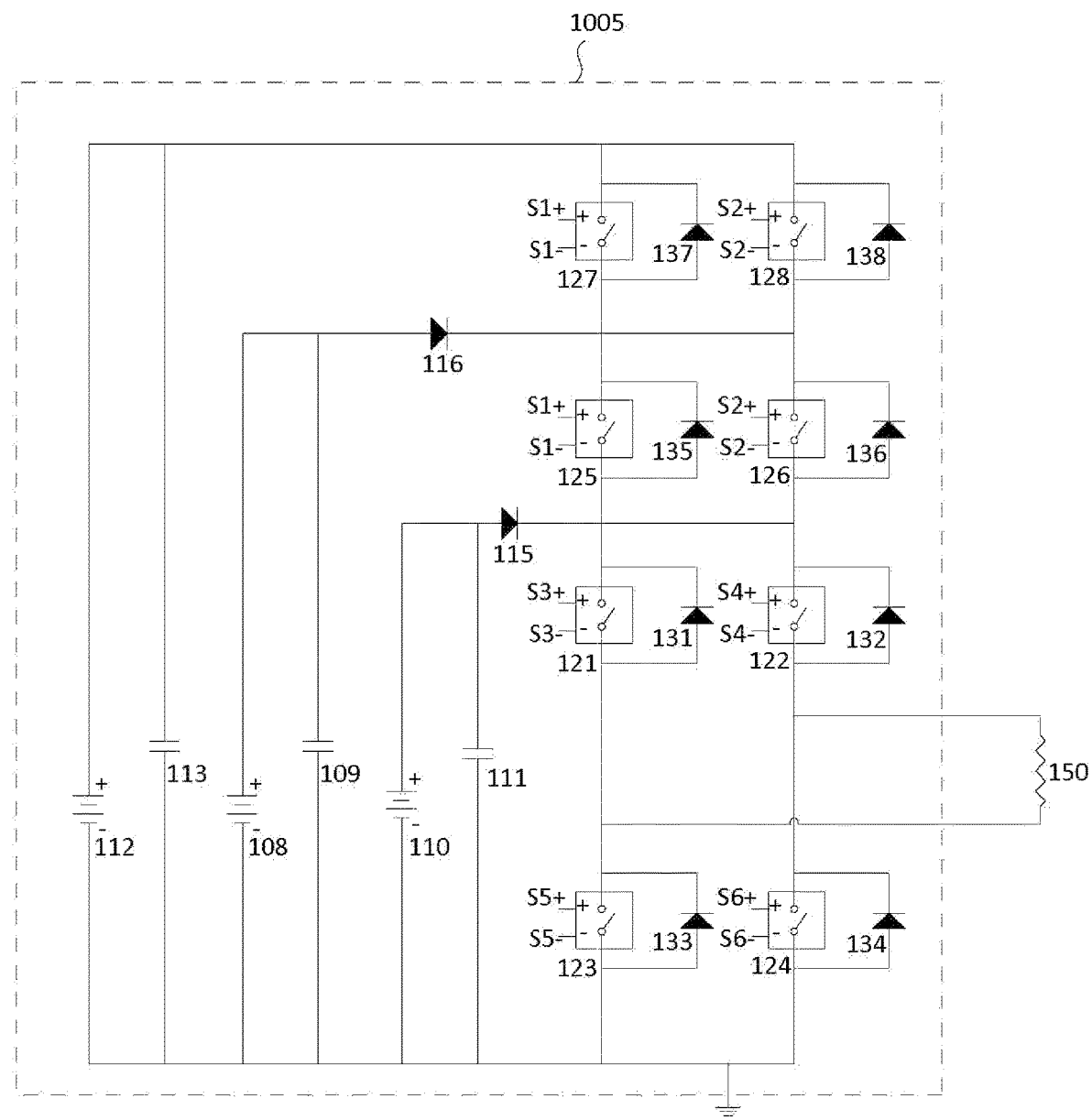
FIG. 10 is an example illustration of a high voltage, bipolar, multilevel, bipolar pulsing power supply driving a load.

The bipolar pulsing power supply 605 may include additional switch circuit to produce additional multilevel pulses. FIG. 10 shows an example high voltage, multilevel, bipolar pulsing power supply 1005 with a seventh switch circuit 127 and an eighth switch circuit 128 coupled with a third DC source 112 and a third energy storage capacitor 113. The seventh switch circuit 127 may include a corresponding diode 137 and the eighth switch circuit 128 may include a corresponding diode 138. An additional diode 116 may also be included between the second DC source 108 and the second energy storage capacitor 109 and both the fifth switch circuit 125 and the sixth switch circuit 126. The third DC source 112 may have a voltage greater than the first DC source 110 and/or the second DC source 108. The high voltage bipolar pulsing power supply 1005 may produce multilevel pulses with three levels of voltage.

Additional DC sources and switch circuits may be added to create additional multilevel pulses of any number of voltage levels.

Figure 11:
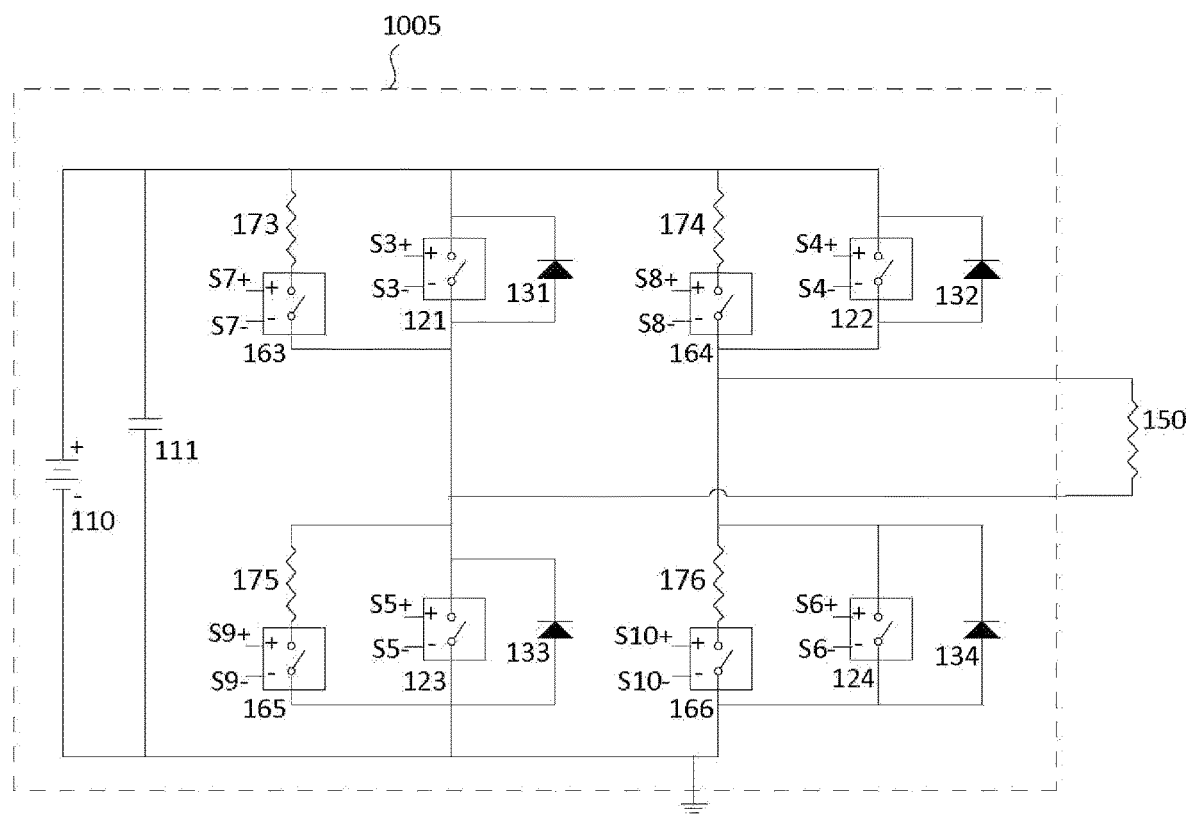
FIG. 11 is an example illustration of a high voltage bipolar pulsing power supply driving a load.

FIG. 11 shows an example high voltage bipolar pulsing power supply 1005 driving the load 150. In this example, the high voltage bipolar pulsing power supply 105 includes four tail sweeper switches (e.g., switches 163, 164, 165, 166) and corresponding tail sweeper resistors (e.g., resistors 173, 174, 175, and 176). Alternatively, the tail sweeper resistors can be replaced with inductors or capacitors.

The first tail sweeper switch 163 and the first tail sweeper resistor 173 are coupled across the first switch circuit 121, the second tail sweeper switch 164 and the second tail sweeper resistor 174 are coupled across the second switch circuit 122, the third tail sweeper switch 165 and the third tail sweeper resistor 175 are coupled across the third switch circuit 123, and the fourth tail sweeper switch 166 and the fourth tail sweeper resistor 176 are coupled across the fourth switch circuit 124. Each tail sweeper switch can be closed prior to the corresponding switch circuit to dissipate any tail current in the circuit into the tail sweeper resistor as shown in FIG. 12B.

Figure 12A:
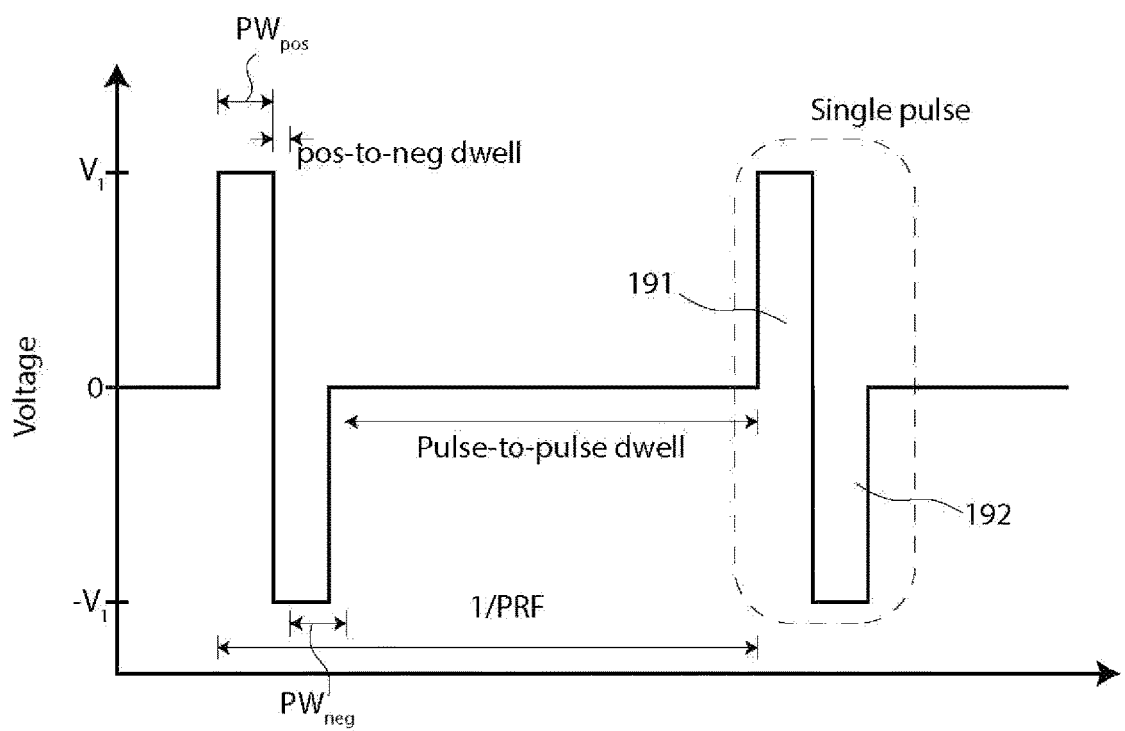
FIG. 12A shows an output waveform at the load from the bipolar, pulsing power supply shown in FIG. 11.
Figure 12B:
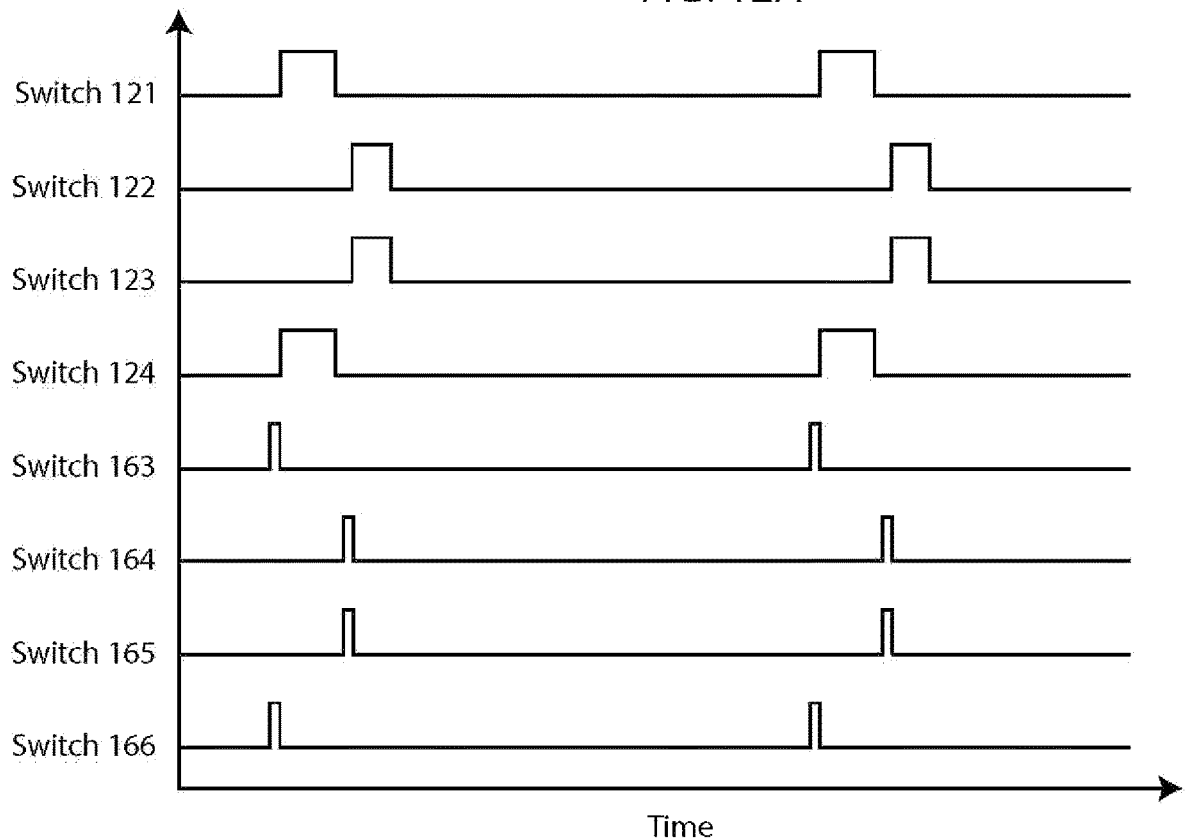
FIG. 12B shows the open and close switch logic of the switches in the bipolar, pulsing power supply shown in FIG. 11 to produce the waveforms shown in FIG. 12A.

FIG. 12A shows bipolar pulses produced with the high voltage bipolar pulsing power supply 1005. FIG. 12B shows the shows the open and close switch logic of the switch circuits 121, 122, 123, 124, 125, and 126 and/or the tail sweeper switches 163, 164, 165, and 166 to produce the bipolar waveforms shown in FIG. 12A. For example, the tail sweeper switch 163 and the tail sweeper switch 166 are closed prior to closing the first switch circuit 121 and the fourth switch circuit 124. And the tail sweeper switch 164 and the tail sweeper switch 165 are closed prior to closing the second switch circuit 122 and the third switch circuit 123. By closing the tail sweeper switch 164 and the tail sweeper switch 165 prior to closing the second switch circuit 122 and the third switch circuit 123, the dwell between the positive pulse 191 and the negative pulse 192 can be substantially eliminated or completely eliminated.

Figure 13:
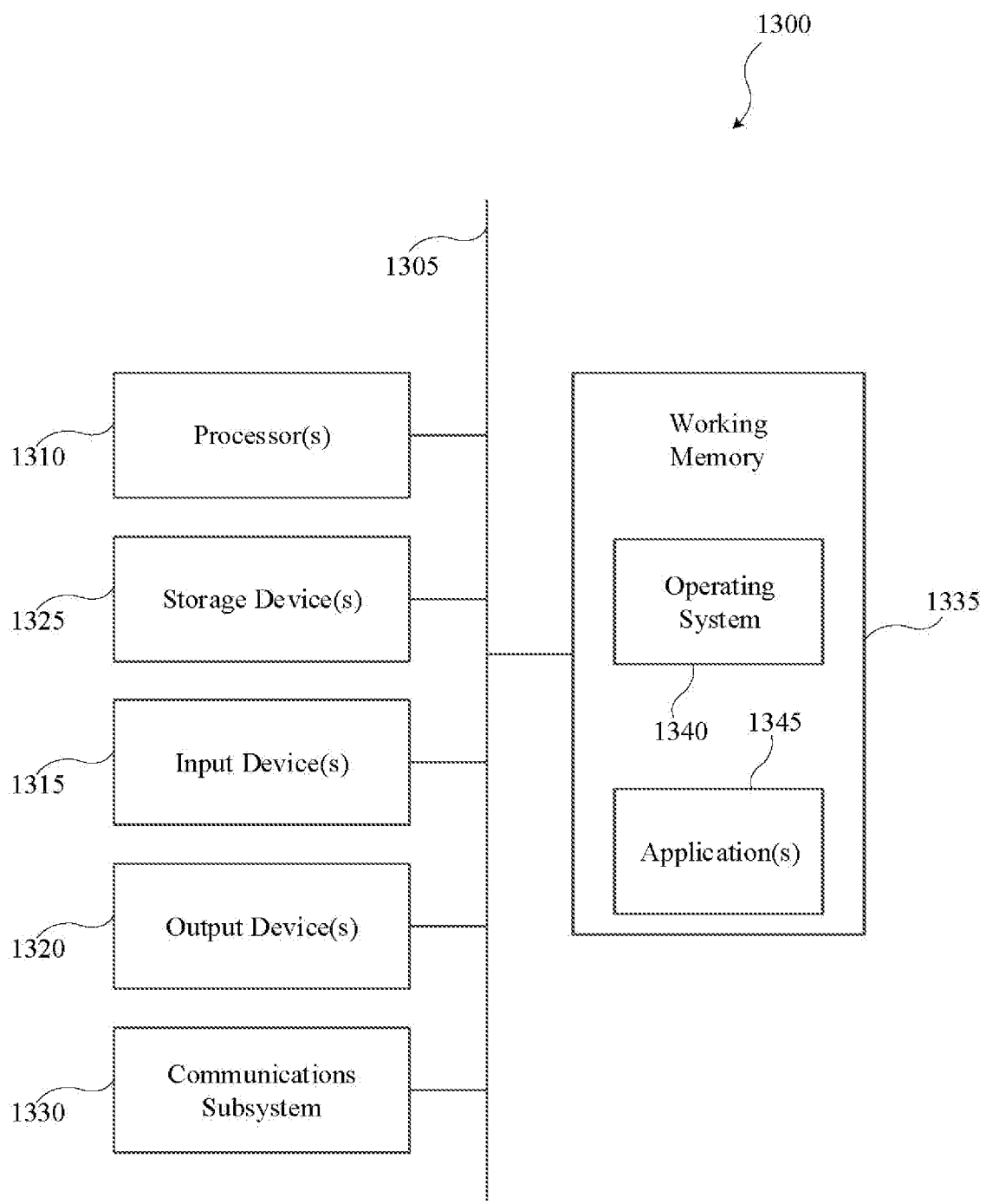
FIG. 13 is a block diagram of a computational system that can be used to with or to perform some embodiments described in this document.

The computational system 1300, shown in FIG. 13 can be used to perform any of the embodiments of the invention. For example, computational system 1300 can be used to control the switching of the various switch circuits described in this document. As another example, computational system 1300 can perform any calculation, identification and/or determination described here. The computational system 1300 may include hardware elements that can be electrically coupled via a bus 1305 (or may otherwise be in communication, as appropriate). The hardware elements can include one or more processors 1310, including without limitation one or more general-purpose processors and/or one or more special-purpose processors (such as digital signal processing chips, graphics acceleration chips, and/or the like); one or more input devices 1315, which can include without limitation a mouse, a keyboard and/or the like; and one or more output devices 1320, which can include without limitation a display device, a printer and/or the like.

The computational system 1300 may further include (and/or be in communication with) one or more storage devices 1325, which can include, without limitation, local and/or network accessible storage and/or can include, without limitation, a disk drive, a drive array, an optical storage device, a solid-state storage device, such as a random access memory ("RAM") and/or a read-only memory ("ROM"), which can be programmable, flash-updateable and/or the like. The computational system 1300 might also include a communications subsystem 1330, which can include without limitation a modem, a network card (wireless or wired), an infrared communication device, a wireless communication device and/or chipset (such as a Bluetooth device, an 802.6 device, a Wi-Fi device, a WiMax device, cellular communication facilities, etc.), and/or the like. The communications subsystem 1330 may permit data to be exchanged with a network (such as the network described below, to name one example), and/or any other devices described in this document. In many embodiments, the computational system 1300 will further include a working memory 1335, which can include a RAM or ROM device, as described above.

The computational system 1300 also can include software elements, shown as being currently located within the working memory 1335, including an operating system 1340 and/or other code, such as one or more application programs 1345, which may include computer programs of the invention, and/or may be designed to implement methods of the invention and/or configure systems of the invention, as described herein. For example, one or more procedures described with respect to the method(s) discussed above might be implemented as code and/or instructions executable by a computer (and/or a processor within a computer). A set of these instructions and/or codes might be stored on a computer-readable storage medium, such as the storage device(s) 1325 described above.

In some cases, the storage medium might be incorporated within the computational system 1300 or in communication with the computational system 1300. In other embodiments, the storage medium might be separate from a computational system 1300 (e.g., a removable medium, such as a compact disc, etc.), and/or provided in an installation package, such that the storage medium can be used to program a general-purpose computer with the instructions/code stored thereon. These instructions might take the form of executable code, which is executable by the computational system 1300 and/or might take the form of source and/or installable code, which, upon compilation and/or installation on the computational system 1300 (e.g., using any of a variety of generally available compilers, installation programs, compression/decompression utilities, etc.) then takes the form of executable code.

Unless otherwise specified, the term "substantially" means within 5% or 10% of the value referred to or within manufacturing tolerances. Unless otherwise specified, the term "about" means within 5% or 10% of the value referred to or within manufacturing tolerances.

The conjunction "or" is inclusive.

The terms "first", "second", "third", etc. are used to distinguish respective elements and are not used to denote a particular order of those elements unless otherwise specified or order is explicitly described or required.

Numerous specific details are set forth to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. A high voltage bipolar pulsing power supply comprising:
    a DC source;
    an energy storage capacitor coupled with the DC source;
    a first high voltage switch electrically coupled with the DC source and the energy storage capacitor;
    a first diode arranged across the first high voltage switch;
    a first tail sweeper switch and a first tail sweeper resistor arranged in series across the first high voltage switch;
    a second high voltage switch electrically coupled with the DC source and the energy storage capacitor;
    a second diode arranged across the second high voltage switch;
    a second tail sweeper switch and a second tail sweeper resistor arranged in series across the first high voltage switch;
    a third high voltage switch arranged in series between the first high voltage switch and ground;
    a third diode arranged across the third high voltage switch;
    a third tail sweeper switch and a third tail sweeper resistor arranged in series across the first high voltage switch;
    a fourth high voltage switch arranged in series between the second high voltage switch and ground;
    a fourth diode arranged across the fourth high voltage switch;
    a fourth tail sweeper switch and a fourth tail sweeper resistor arranged in series across the first high voltage switch and
    an output having a first lead electrically coupled between the first high voltage switch and the third high voltage switch and a second lead electrically coupled between the second high voltage switch and the fourth high voltage switch, the output providing a plurality of high voltage pulses where each pulse of the plurality of pulses includes a positive pulse having a voltage greater than about 500 volts and a negative pulse having a negative voltage less than about −500 volts.

2. The high voltage bipolar pulsing power supply according to claim 1, wherein the output high voltage pulses with a pulse repetition rate greater than about 10 kHz.

3. The high voltage bipolar pulsing power supply according to claim 1, wherein the first high voltage switch comprises a first plurality of solid state switches arranged in parallel, the second high voltage switch comprises a second plurality of solid state switches arranged in parallel, the third high voltage switch comprises a third plurality of solid state switches arranged in parallel, and the fourth high voltage switch comprise a fourth plurality of solid state switches arranged in parallel.

4. The high voltage bipolar pulsing power supply according to claim 1, wherein the first high voltage switch, the second high voltage switch, the third high voltage switch, and the fourth high voltage switch each comprise a switch selected from the group consisting of an IGBT, a MOSFET, a SiC MOSFET, a SiC junction transistor, a FET, a SiC switch, a GaN switch, and a photoconductive switch.

5. The high voltage bipolar pulsing power supply according to claim 1, wherein the circuit comprising both the DC source and the energy storage capacitor has an inductance less than about 10 nH.

6. The high voltage bipolar pulsing power supply according to claim 1, wherein the circuit comprising both the first high voltage switch and the second high voltage switch has an inductance less than about 10 nH.

7. The high voltage bipolar pulsing power supply according to claim 1, wherein both the first lead of the output and the second lead of the output are coupled with an electrode.

8. The high voltage bipolar pulsing power supply according to claim 7, wherein the electrode comprises an electrode for ablation or an electrode for electroporation.

9. A high voltage, multilevel, bipolar pulsing power supply comprising:
    a first DC source;

a first energy storage capacitor coupled with the first DC source;

a diode having an anode and a cathode, the anode electrically coupled with the first DC source and the first energy storage capacitor;

a first high voltage switch electrically coupled with the cathode of the first diode;

a first diode arranged across the first high voltage switch;

a second high voltage switch electrically coupled with the cathode of the first diode;

a second diode arranged across the second high voltage switch;

a third high voltage switch arranged in series between the first high voltage switch and ground;

a third diode arranged across the third high voltage switch;

a fourth high voltage switch arranged in series between the second high voltage switch and ground;

a fourth diode arranged across the fourth high voltage switch;

a second DC source;

a second energy storage capacitor coupled with the second DC source;

a fifth high voltage switch electrically coupled with the second DC source and the second energy storage capacitor;

a fifth diode arranged across the fifth high voltage switch;

a sixth high voltage switch electrically coupled with the cathode of the second DC source and the second energy storage capacitor;

a sixth diode arranged across the sixth high voltage switch; and an output having a first lead electrically coupled between the first high voltage switch and the third high voltage switch and the second lead electrically coupled between the second high voltage switch and the fourth high voltage switch.

10. The high voltage, multilevel, bipolar pulsing power supply according to claim 9, wherein the output provides a plurality of high voltage pulses each pulse of the plurality of high voltage pulses having a first positive pulse with a voltage greater than 500 volts, a second high pulse with a positive voltage greater than the voltage of the first positive pulse, and a negative pulse with a voltage less than −500 volts.

11. The high voltage, multilevel, bipolar pulsing power supply according to claim 9, wherein the second DC source produces a voltage greater than the first DC source.

12. The high voltage, multilevel, bipolar pulsing power supply according to claim 9, wherein:

the first high voltage switch, the fourth high voltage switch, and the fifth high voltage switch are closed to produce a voltage at the output equal to a voltage of the second DC source;

the second high voltage switch, the third high voltage switch, and the sixth high voltage switch are closed to produce a voltage at the output equal to a negative voltage of the second DC source;

the first high voltage switch and the fourth high voltage switch are closed to produce a voltage at the output equal to a voltage of the first DC source; and the second high voltage switch and the third high voltage switch are closed to produce a voltage at the output equal to a negative voltage of the first DC source.

13. The high voltage bipolar pulsing power supply according to claim 9, wherein the first high voltage switch, the second high voltage switch, the third high voltage switch, the fourth high voltage switch, the fifth high voltage switch, and the sixth high voltage switch each have a capacitance less than about 500 pF.

14. The high voltage bipolar pulsing power supply according to claim 9, further comprising:

a first tail sweeper switch and a first tail sweeper resistor arranged in series across the first high voltage switch;

a second tail sweeper switch and a second tail sweeper resistor arranged in series across the first high voltage switch;

a third tail sweeper switch and a third tail sweeper resistor arranged in series across the first high voltage switch;

a fourth tail sweeper switch and a fourth tail sweeper resistor arranged in series across the first high voltage switch;

a fifth tail sweeper switch and a fifth tail sweeper resistor arranged in series across the fifth high voltage switch; and a sixth tail sweeper switch and a sixth tail sweeper resistor arranged in series across the sixth high voltage switch.

15. A high voltage bipolar pulsing power supply comprising:

a DC source;

an energy storage capacitor coupled with the DC source;

a diode having an anode and a cathode, the anode electrically coupled with the DC source and the energy storage capacitor;

a first high voltage switch electrically coupled with the cathode of the diode;

a first diode arranged across the first high voltage switch;

a first tail sweeper switch and a first tail sweeper resistor arranged in series across the first high voltage switch;

a second high voltage switch electrically coupled with the cathode of the diode;

a second diode arranged across the second high voltage switch;

a second tail sweeper switch and a second tail sweeper resistor arranged in series across the first high voltage switch;

a third high voltage switch arranged in series between the first high voltage switch and ground;

a third diode arranged across the third high voltage switch;

a third tail sweeper switch and a third tail sweeper resistor arranged in series across the first high voltage switch;

a fourth high voltage switch arranged in series between the second high voltage switch and ground;

a fourth diode arranged across the fourth high voltage switch;

a fourth tail sweeper switch and a fourth tail sweeper resistor arranged in series across the first high voltage switch; and an output having a first lead electrically coupled between the first high voltage switch and the third high voltage switch and a second lead electrically coupled between the second high voltage switch and the fourth high voltage switch, the output providing a plurality of high voltage pulses where each pulse of the plurality of pulses includes a positive pulse having a voltage greater than about 500 volts and a negative pulse having a negative voltage less than about −500 volts.

16. The high voltage bipolar pulsing power supply according to claim 15, wherein:

the first tail sweeper switch is closed prior to the first high voltage switch being closed;

the second tail sweeper switch is closed prior to the second high voltage switch being closed;

the third tail sweeper switch is closed prior to the third high voltage switch being closed; and the fourth tail sweeper switch is closed prior to the fourth high voltage switch being closed.

17. The high voltage bipolar pulsing power supply according to claim 15, wherein the first high voltage switch, the second high voltage switch, the third high voltage switch, and the fourth high voltage switch each comprise a switch selected from the group consisting of an IGBT, a MOSFET, a SiC MOSFET, a SiC junction transistor, a FET, a SiC switch, a GaN switch, and a photoconductive switch.

18. The high voltage bipolar pulsing power supply according to claim 15, wherein the first tail sweeper switch, the second tail sweeper switch, the third tail sweeper switch, and the fourth tail sweeper switch each comprise a switch selected from the group consisting of an IGBT, a MOSFET, a SiC MOSFET, a SiC junction transistor, a FET, a SiC switch, a GaN switch, and a photoconductive switch.

19. The high voltage bipolar pulsing power supply according to claim 15, wherein the circuit between the diode and both the DC source and the energy storage capacitor has an inductance less than about 10 nH.

20. The high voltage bipolar pulsing power supply according to claim 15, wherein the circuit between the diode and the first high voltage switch and the second high voltage switch has an inductance less than about 10 nH.

21. The high voltage bipolar pulsing power supply according to claim 15, wherein both the first lead of the output and the second lead of the output are coupled with an electrode.

22. The high voltage bipolar pulsing power supply according to claim 21, wherein the electrode comprises an electrode for ablation or an electrode for electroporation.

* * * * *